(12) United States Patent
Takada et al.

(10) Patent No.: US 7,626,128 B2
(45) Date of Patent: Dec. 1, 2009

(54) CONDUCTIVE FILM

(75) Inventors: Yasushi Takada, Otsu (JP); Shotaro Tanaka, Kusatsu (JP); Junpei Ohashi, Otsu (JP)

(73) Assignee: Toray Industries, Inc. (JP)

( * ) Notice: Subject to any disclaimer, the term of this patent is extended or adjusted under 35 U.S.C. 154(b) by 244 days.

(21) Appl. No.: 11/664,559

(22) PCT Filed: Oct. 6, 2005

(86) PCT No.: PCT/JP2005/018509

§ 371 (c)(1),
(2), (4) Date: Apr. 3, 2007

(87) PCT Pub. No.: WO2006/040989

PCT Pub. Date: Apr. 20, 2006

(65) Prior Publication Data

US 2007/0264530 A1    Nov. 15, 2007

(30) Foreign Application Priority Data

Oct. 8, 2004    (JP) ............................. 2004-296051

(51) Int. Cl.
*H05K 9/00*   (2006.01)
(52) U.S. Cl. ..................... 174/393; 174/389; 174/390
(58) Field of Classification Search .......... 174/388–393
See application file for complete search history.

(56) References Cited

U.S. PATENT DOCUMENTS

| 5,391,472 | A | 2/1995 | Muys et al. | |
|---|---|---|---|---|
| 6,086,979 | A * | 7/2000 | Kanbara et al. | 428/209 |
| 6,197,408 | B1 * | 3/2001 | Kanbara et al. | 428/209 |
| 6,884,936 | B2 * | 4/2005 | Takahashi et al. | 174/389 |
| 7,172,822 | B2 * | 2/2007 | Shibata | 428/690 |
| 7,205,098 | B2 * | 4/2007 | Cho et al. | 430/321 |
| 2004/0177982 | A1 * | 9/2004 | Shibata | 174/35 MS |

FOREIGN PATENT DOCUMENTS

| EP | 0 602 713 A1 | 6/1994 |
|---|---|---|
| JP | 10-312715 A | 11/1998 |
| JP | 10-340629 A | 12/1998 |
| JP | 11-119672 A | 4/1999 |
| JP | 2000-6324 A | 1/2000 |
| JP | 2001-60416 A | 3/2001 |
| JP | 2001-210988 A | 8/2001 |
| JP | 2002-185184 A | 6/2002 |
| JP | 2003-71976 A | 3/2003 |
| JP | 2003-331654 A | 11/2003 |
| JP | 2004-228057 A | 8/2004 |
| JP | 2004-281941 A | 10/2004 |
| WO | WO 03/068674 A1 | 8/2003 |

* cited by examiner

*Primary Examiner*—Cathy Lam
(74) *Attorney, Agent, or Firm*—DLA Piper LLP (US)

(57) ABSTRACT

A conductive film has transparency and a high level of electrical conductivity, which is used for an electromagnetic interference film hardly causing a moiré phenomenon, and the like. To achieve the above-mentioned aim, the following disclosure is disclosed. A conductive film in which a conductive portion of a random network structure is present on at least one surface of a base film, a line width of the conductive portion composing the network structure is 30 µm or less, an area of portions where the conductive portion is not present is 50% or more with respect to an area of the conductive film, and an average of ratios of a major axis length to a minor axis length of an area surrounded by the network of the conductive portion, in which the base film is exposed, is larger than 1 and is equal to or less than 3.5.

7 Claims, 5 Drawing Sheets

200 µm

CONDUCTIVE FILM

RELATED APPLICATION

This is a §371 of PCT/JP2005/018509, with an international filing date of Oct. 6, 2005 (WO 2006/040989 A1, published Apr. 20, 2006), which is based on Japanese Patent Application No. 2004-296051, filed Oct. 8, 2004.

TECHNICAL FIELD

This disclosure relates to a conductive film which is suitable for an electromagnetic interference film capable of being used for flat panel displays such as a plasma display panel and a liquid crystal television.

BACKGROUND ART

Generally, a variety of electromagnetic waves are emitted from electronic equipment including household electrical appliances, mobile phones, personal computers, and televisions. A strong electromagnetic wave is also emitted from flat panel displays such as a plasma display panel and a liquid crystal television among significantly increasing digital household electrical appliances, and its influence on the human health is also concerned. People observe the images of such displays within a distance relatively close to these displays and for long time in some cases. By doing so, an electromagnetic interference film suppressing these electromagnetic waves is required and the development thereof has been intensively investigated.

In electromagnetic interference films known at present, various methods for suppressing these electromagnetic waves are adopted. For example, a method, in which copper foil is bonded to a polyester film, a regular mesh shape is patterned by photolithography, and etching is performed in such a way that the copper foil becomes a network configuration to prepare a conductive film in which a conductive portion is made from copper and has a network structure, is disclosed in Japanese Unexamined Patent Publication No. 2001-210988 (page 1, claims etc.).

As another method, a method of fabricating a conductive film by printing a composition containing a nucleic agent for plating such as palladium on a film such as polyester in a regular form of network by a printing method and further by applying nonelectrolytic copper plating to a layer consisting of the composition in the form of network is disclosed in Japanese Unexamined Patent Publication No. 2002-185184 (page 1, claims etc,).

As further method, a method of fabricating a conductive film by bonding a knit of metal fiber woven in length and width onto a polyester film or the like is disclosed in Japanese Unexamined Patent Publication No. 11-119672 (page 1, claims etc.).

Further, a conductive body in the form of network which is obtained by initiating micro-cracks in the random form of network and by filling the micro-cracks with a conductive material is disclosed in Japanese Unexamined Patent Publication No. 2004-228057 (page 1, claims etc.), a transparent conductive film provided with a layer in which metal fine particles coagulate in the random form of network is disclosed in Japanese Unexamined Patent Publication No. 2003-71976 (page 1, claims etc.), transparent conductive film provided with a layer containing silver colloidal particles is disclosed in Japanese Unexamined Patent Publication No. 2001-60416 (page 1, claims etc.), and a transparent conductive layer having a fine network structure using silver is disclosed in Japanese Unexamined Patent Publication No. 10-312715 (page 1, claims etc.).

However, there are the following problems in the prior art described above.

A method for etching copper foil is an excellent method for attaining a highly precise network structure, but it is generally low in yields in the steps of bonding copper foil, photolithography, and etching and consequently the yield of a final product becomes low. Further, since a hazardous waste fluid is produced in the etching step, safety and environmental precautions are required. Further, when the copper foil is used as a material, there is also a problem that much of the copper foil is eluted through etching to generate a waste fluid and therefore an amount of a material to be recovered is large.

A method of producing a conductive film by a nonelectrolytic plating process has a feature that an amount of metal waste fluid to be treated is small since metal is used for only required portion. But, since it is difficult to form a pattern of more fine line in the step of printing a mesh form, which is a first step, it is consequently difficult to obtain a conductive film having a conductive portion of a fine line.

A method of bonding metal fiber is a very simple method and readily attains the effect of shielding an electromagnetic wave, but it has a problem that it is difficult to make the network of a conductive portion fine.

The other large problem in technologies described above is a moiré phenomenon occurring when the conductive film is used as an electromagnetic interference film at the surface of a display. The moiré phenomenon is a phenomenon of a fleck pattern in stripe form generated when patterns in which dots or lines are geometrically regularly distributed are superimposed. As for the flat panel display, a moiré in stripe form tends to arise on a screen. This moiré phenomenon arises by an interaction between the pattern of display devices of respective RGB colors of a display main body and the regular configuration of the network of the electromagnetic interference film placed in front of the display main body. These are arrayed regularly to each other, and particularly the display device cannot be changed from a regular configuration to an irregular configuration.

It could be helpful to provide an excellent conductive film which is easy to produce and hardly causes a moiré phenomenon when it is applied to flat panel displays as an electromagnetic interference film.

SUMMARY

We thus provide:

(1) A conductive film in which a conductive portion of a random network structure is present on at least one surface of a base film, a line width of the conductive portion composing the network structure is 30 µm or less, an area of portions where the conductive portion is not present is 50% or more with respect to an area of the conductive film, and an average of ratios of a major axis length to a minor axis length of an area surrounded by the network of the conductive portion, in which the base film is exposed, is larger than 1 and is equal to or less than 3.5.

(2) The conductive film according to the above (1), wherein the conductive portion of a random network structure is obtained by the steps of applying a solution for forming a conductive portion to the base film and drying the solution.

(3) The conductive film according to any one of the above, wherein the conductive portion contains a conductive polymer and/or a conductive particle.

(4) The conductive film according to any one of the above, wherein the conductive portion of the conductive film includes a layer containing a conductive polymer and/or a conductive particle, and a metal layer provided on the layer.

(5) The conductive film according to any one of the above, wherein the prime constituent of metal to form the metal layer is copper.

(6) The conductive film according to any one of the above, wherein the conductive film is an electromagnetic interference film.

It is now possible to provide a conductive film having transparency and a high level of electrical conductivity as well as less moiré, and further it is possible to provide an excellent electromagnetic interference film hardly causing a moiré phenomenon when a metal layer is provided on its conductive portion. This conductive film is very useful for flat panel displays such as a plasma display panel and a liquid crystal television.

DESCRIPTION OF THE REFERENCE NUMERALS

1: conductive portion

Figure 1:
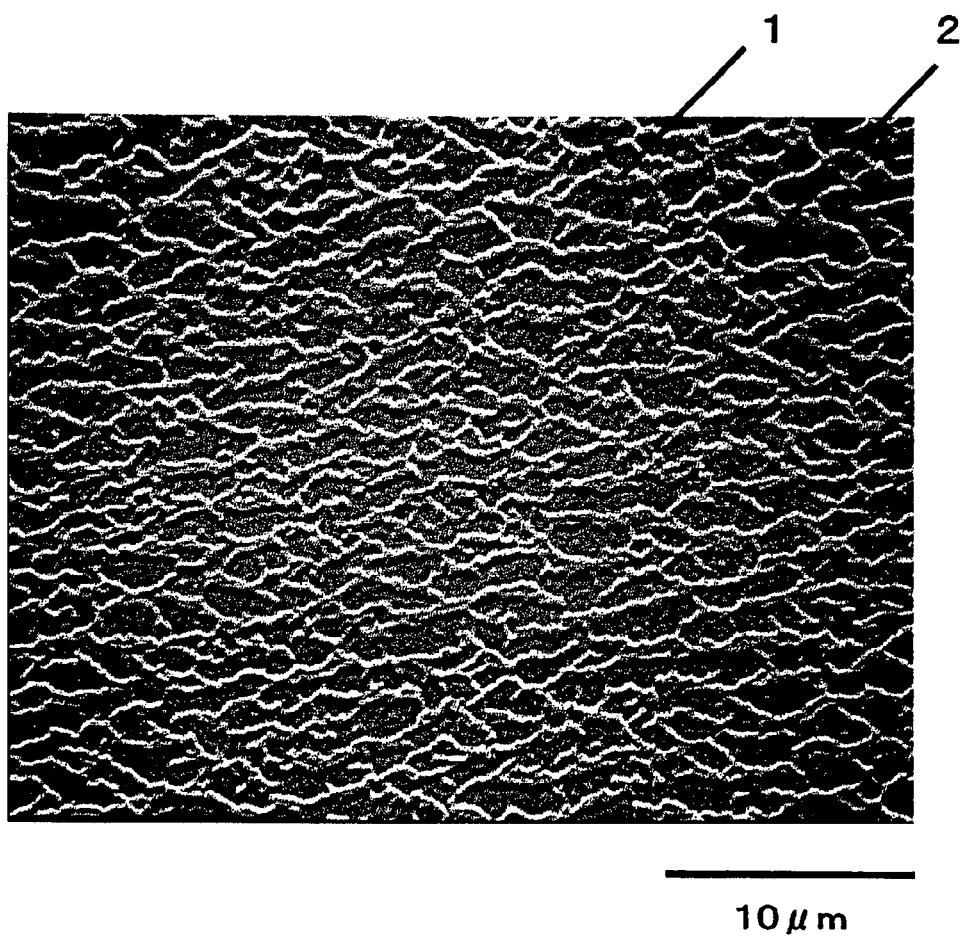
FIG. 1 is a scanning electron microscope observation image showing an example of a random network structure.

2: area where a base film is exposed, having no conductive portion on it

DETAILED DESCRIPTION

Our conductive film is a conductive film in which a conductive portion of a random network structure is present on at least one surface of a base film, a line width of the conductive portion composing the network structure is 30 µm or less, an area of portions where the conductive portion is not present is 50% or more with respect to an area of the conductive film, and an average of ratios of a major axis length to a minor axis length of an area surrounded by the network of the conductive portion, in which the base film is exposed, is larger than 1 and is equal to or less than 3.5.

The base film is preferably a film composed of a resin. Preferably, the resin is further a thermoplastic resin. The thermoplastic resin film collectively refers to films which are melted or softened by heating. The thermoplastic resin film is not particularly limited, and typical examples of thermoplastic resin films to be used may include polyester films; polyolefin films such as polypropylene films and polyethylene films; polylactic acid films; polycarbonate films; acrylic films such as polymethyl methacrylate films and polystyrene films; polyamide films such as nylon; polyvinyl chloride films; polyurethane films; fluorine-based films; and polyphenylene sulfide films.

A resin composing the base film may be homopolymers or copolymers. Among them, polyester films, polypropylene films, polyamide films, and the like are preferable from the viewpoint of mechanical properties, the dimensional stability, the transparency, and the like, and furthermore, polyester films are preferable from the viewpoint of the mechanical strength, the general versatility, and the like.

These films may contain various additives, e.g., antioxidants, heat stabilizers, weathering stabilizers, ultraviolet absorbers, organic lubricants, pigments, dyes, organic or inorganic fine particles, fillers, antistatic agents and crystal nucleating agents, to the extent that the characteristic properties are not deteriorated.

The thickness of the base film is not specifically limited, and is appropriately selected in accordance with the applications and the kinds of the conductive film. Preferably, the thickness is usually 10 to 500 µm, more preferably is 38 to 250 µm, and most preferably is 75 to 150 µm from the viewpoint of the mechanical strength, handleability, and the like.

The example in which a polyester film is used as a base film of the conductive film will be described below.

A polyester composing a polyester film refers to polymers in which ester bonding is a primary bonding chain in a main chain. As the polyester, polyethylene terephthalate, polyproylene terephthalate, ethylene-2,6-naphthalate, polybutylene terephthalate, polypropylene-2,6-naphthalate, polyethylene-$\alpha,\beta$-bis (2-chlorophenoxy)ethane-4,4'-dicarboxylate, and the like are exemplified, and polyesters including at least one constituent selected from the group consisting of the above-mentioned polymers as a primary constituent can be preferably used.

These constituents may be used alone or in combination of two or more kinds. Most of all, it is particularly preferable to use polyethylene terephthalate, considering collectively all the factors, e.g., quality and economy, involved. When the conductive film is used for the case where there is a step of performing intensive heat treatment or tending to produce shrinkage stress, polyethylene-2,6-naphthalate having excellent heat resistance and stiffness is also suitably used. Other dicarboxylic acid components and/or idol components may be copolymerized as a part of two polyesters exemplified here, preferably at 20 mole percent or less. Also, hydroxyl carboxylic acid components may be copolymerized.

It is suitable for performing the disclosure that the intrinsic viscosity (measured in o-chlorophenol at 25° C.) of the above-described polyester is preferably within the range of 0.4 to 1.2 dl/g, and more preferably within the range of 0.5 to 0.8 dl/g.

Preferably, the polyester film of a base material is biaxially oriented. In general, the biaxially oriented polyester film refers to a polyester film which is prepared by stretching an unstretched polyester sheet or film preferably by about 2.5 to 5 times in each of a longitudinal direction and a width direction, respectively, and then processing the film with a heat treatment to complete crystalline orientation. This film exhibits a wide-angle X-ray diffraction pattern attributed to biaxial orientation.

A polyester film to be a base film may be a composite film prepared by coextrusion. On the other hand, the resulting films may also be bonded to each other by various methods to be used.

Next, the conductive portion of a random network structure, which is present on at least one surface of the base film, will be described.

The random network structure is observed as a structure in such a random state that a shape and a size of an area surrounded by the conductive portion, in which the conductive portion is not present, are irregular when the conductive film is observed with a scanning electron microscope (hereinafter, abbreviated as "SEM"). Therefore, the shape of the conductive portion is observed as a shape in an irregular state.

Figure 2:
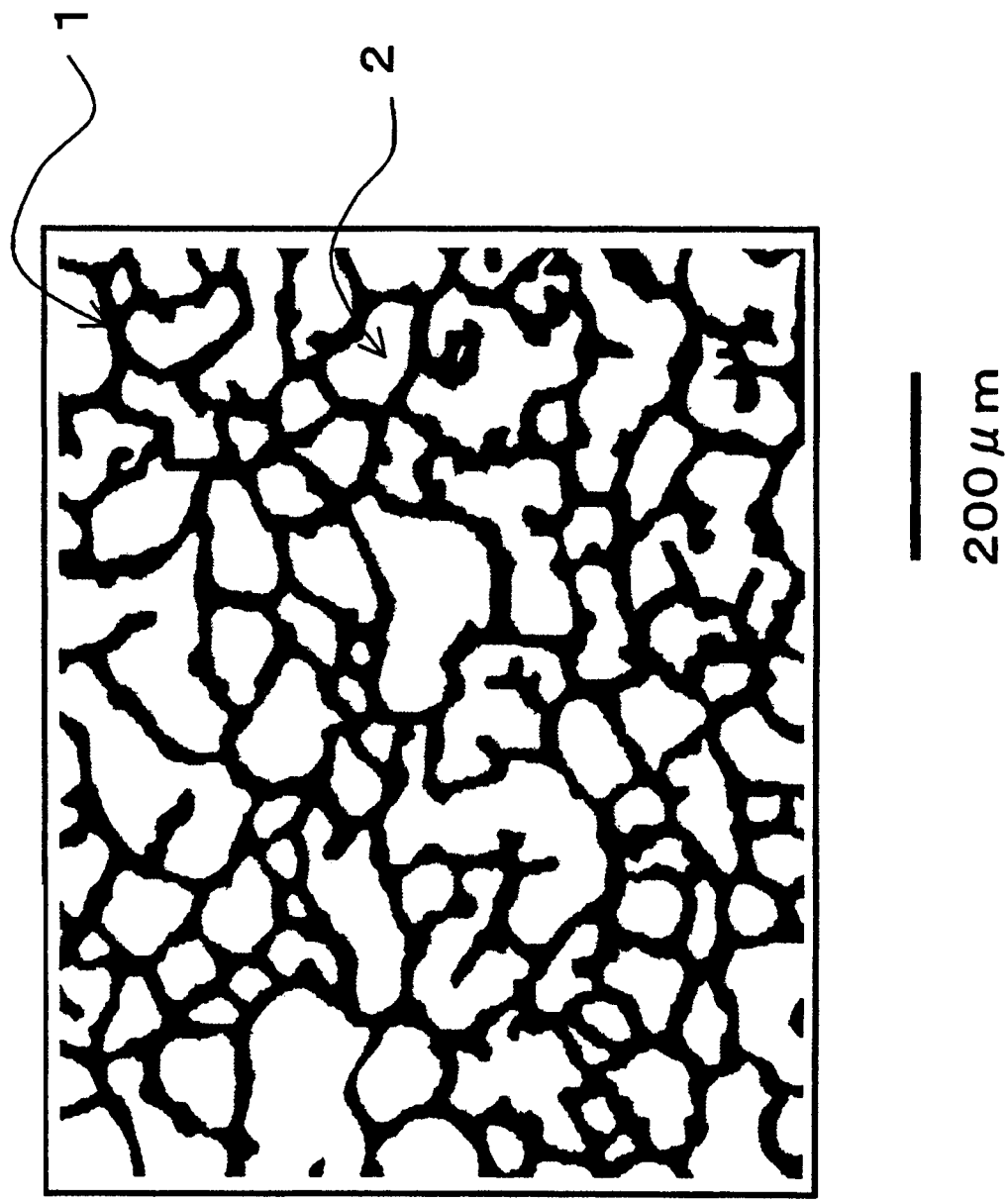
FIG. 2 is a scanning electron microscope observation image showing an example of a random network structure.

A SEM observation image of the conductive layer formed on a base film of the conductive film is shown in FIGS. 1 and 2. FIG. 1 shows an example of a SEM observation image of a conductive portion consisting of a conductive portion of a random network structure and a base film. It can be said that this configuration is similar to the surface of a muskmelon. Straight lines in the lower right-hand corner of the drawings are scales, and for example in FIG. 1, the length of the straight line in the lower right-hand corner represents 10 μm.

A width of the conductive portion needs to be 30 μm or less. A line width of the conductive portion may be constant or may vary, and for example, in FIG. 1, the conductive portion is observed as a mesh having line widths varying from about 0.3 μm to about 1 μm. This width is usually at least 0.2 μm, and 0.5 to 25 μm, and preferably 1 to 20 μm. When the width of the conductive portion is too small, electrical conductivity is hardly exhibited, and on the other hand, when it is too large, a total light transmittance is apt to decrease in the case of using the conductive film as an electromagnetic interference film and the conductive film is readily observed.

It is preferable that at least a part of the conductive portion of the network structure is continuous. When the conductive portion is not continuous, this can be distinguished through from that the electrical conductivity of the surface is not exhibited.

In the conductive film, it is necessary that an area of portions where the conductive portion is not present is 50% or more with respect to an area of the conductive film, and this area is preferably 60% or more, and more preferably 70% or more particularly from the viewpoint of transparency.

When the percentage of this area is low, it is not desirable since a total light transmittance is lowered in the case of using the conductive film as an electromagnetic interference film. On the other hand, an upper limit of the percentage of this area may be less than 100%, but it becomes 90% or less in actual production and use.

The electrical conductivity of the surface of the conductive film is not particularly limited as long as an electromagnetic interference function can be attained, but, for example, it is preferably $1 \times 10^5$ Ω/□ or less, more preferably $1 \times 10^3$ Ω/□ or less, and most preferably 1 Ω/□ or less. Further, the electrical conductivity to be used is preferably 0.1 Ω/□ or less in the case of shielding an electromagnetic wave emitted from a PDP television, and the like.

A higher transmittance of the conductive film is preferable, and it is preferably 55% or more, and more preferably 60% or more.

Further, a ratio of a major axis length to a minor axis length of an area (hereinafter, referred to as a "open area") surrounded by the network of the conductive portion, in which the base film is exposed, is important. The major axis length and the minor axis length are determined by following procedure using FIG. 3.

The longest location of an open area surrounded by a watched conductive portion 1 is defined as a major axis A. The length of this location is taken as a major axis length. Assuming two straight lines (B1, B2) in parallel with the defined major axis, the two straight lines are placed so that they circumscribe the open area and a distance between them becomes maximum, and a distance C between these straight lines is taken as a minor axis length.

The average ratios of the major axis length to the minor axis length needs to be larger than 1 and be equal to or less than 3.5. When the ratio is 1, a problem that the regularity of the network portion is enhanced and a moiré phenomenon tends to occur. When, the ratio is larger than 3.5, there is a problem that anisotropy in images occurs particularly when the conductive film is used in front of an optical illuminant device such as a PDP television. A preferable ratio of the major axis length to the minor axis length is 1.2 or more, and furthermore 1.5 or more for a lower value, and 3 or less, further 2.5 or less, and furthermore 1.8 or less for an upper value.

The conductive portion of the conductive film can be obtained by applying a coating solution containing either a material containing a conductive component or a material to have electrical conductivity through a subsequent operation onto the surface of the film, and drying the coating solution. For example, in a manufacturing step of biaxially stretching a polyester film successively in which a step of stretching in a longitudinal direction and a step of stretching in a width direction are performed, a method in which the coating solution is applied onto the surface of the film and dried between step of stretching in a longitudinal direction and the step of stretching in a width direction and then the dried film is further stretched and heat-treated, that is, the so-called in-line coating method can be used. In the step of stretching a film in a width direction, a layer applied with the coating solution produces cracks through stretching and a conductive portion of the random network structure can be obtained.

As a component contained in the coating solution, a conductive polymer and/or a conductive particle is preferable. As the conductive polymer, polythiophene, polyaniline, polypyrrole, and derivatives thereof can be used, and as the conductive particle, particles of indium oxide, tin oxide, zinc oxide, silver, gold, copper, platinum, nickel, zinc and the like can be used.

In particular, with respect to polythiophene which is a conductive polymer, the development of a coating solution in which water is used as a medium is advanced by the recent research and development, and this coating solution can also be suitably employed in our disclosure. As a coating solution, furthermore preferably, a solution containing a mixture of polythiophene and/or a polythiophene derivative and polyanion (hereinafter, referred to as a "polythiophene-polyanion mixture") can be used.

The above-mentioned polythiophene-polyanion mixture can be obtained by the step of obtaining a polymer having the following repeat structure:

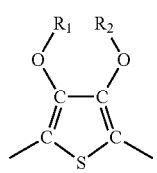

[Formula 1]

and/or the following repeat structure:

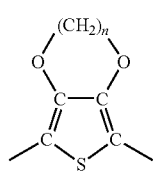

[Formula 2]

by polymerizing a monomer to give polythiophene or a polythiophene derivative in the presence of polyanions. In the first repeat structure, $R_1$ and $R_2$ each independently represent a hydrogen element; or an aliphatic hydrocarbon group, an alicyclic hydrocarbon group, or an aromatic hydrocarbon group, each having 1 to 12 carbon atoms. Examples thereof include a methyl group, an ethyl group, a propyl group, an isopropyl group, a butyl group, a cyclohexylene group, and a benzene group. In the second repeat structure, n represents an integer of 1 to 4.

As a material to give the conductive portion, polythiophene and/or a polythiophene derivative having a structural formula represented by the second repeat structure is preferably used. For example, a preferable compound is represented by the second repeat structure, where n=1 (a methylene group), n=2 (an ethylene group), or n=3 (a trimethylene group). Among them, a compound including an ethylene group in which n=2, that is, poly-3,4-ethylene-dioxythiophene, is particularly preferable.

Further, examples of the polythiophene and/or the polythiophene derivative include compounds having a structure in which substituents are bonded at positions 3 and 4 of a thiophene ring and, furthermore, a compound in which oxygen atoms are bonded to carbon atoms at positions 3 and 4 as described above. With respect to compounds in which hydrogen atoms or carbon atoms are directly bonded to the above-described carbon atoms, water may not be readily used as a medium of the coating solution.

Next, a polyanion compound suitably used for the polythiophene-polyanion mixture will be described.

The polyanion compound is an acid polymer which can be a free acid, and is a polymer having a carboxylic acid, a polymer having a sulfonic acid, or the like. Examples of polymers having a carboxylic acid include polyacrylic acid, polymethacrylic acid, and polymaleic acid. Examples of polymers having a sulfonic acid include polystyrenesulfonic acid, and polyvinylsulfonic acid. In particular, the polystyrenesulfonic acid is most preferable from the viewpoint of the electrical conductivity of a conductive portion to be obtained. Here, a part of functional groups to give free acids may be in the form of neutralized salts.

When these polyanion compounds are added during the step of polymerizing for obtaining polythiophene and/or a polythiophene derivative described above, inherently water-insoluble polythiophene-based compounds are readily dispersed in water or readily dissolved in water. Further, it is believed that the function as an acid serves the function as a dopant of the polythiophene-based compound and also serves an effect of improving the electrical conductivity.

As the polyanion compound described above, copolymers formed by copolymerization of other copolymerizable monomers, e.g., acrylates, methacrylates, and styrene, can also be used.

The molecular weights of the polyanion compounds such as a carboxylic acid-containing polymer and a sulfonic acid-containing polymer are not specifically limited, but, the weight average molecular weight thereof is preferably 1,000 to 1,000,000, and more preferably 5,000 to 150,000 from the viewpoint of the stability of the coating solution and the conductive portion. A part of anions may be neutralized by or may form salts with alkali metals such as lithium, sodium and the like, alkaline earth metals such as calcium and the like, and ammonium ion, to the extent that the characteristic properties of our disclosure are not impaired.

In the polythiophene-polyanion mixture, it is preferable from the viewpoint of the electrical conductivity that the polyanion is allowed to excessively present with respect to the total amount of the polythiophene and the polythiophene derivative on a weight of solid basis. Preferably, the polyanion is more than 1 part by weight and is equal to or less than 5 parts by weight with respect to 1 part by weight of the total of the polythiophene and the polythiophene derivative, and more preferably is more than 1 part by weight and is equal to or less than 3 parts by weight. In addition, the polythiophene-polyanion mixture can be produced by methods described in, for example, Japanese Unexamined Patent Publication No. 2000-6324, European Patent No. 602713, U.S. Pat. No. 5,391,472, and the like, although methods other than them may be adopted.

For example, 3,4-ethylenedioxythiophene is prepared using an alkali metal salt of 3,4-dihydroxythiophene-2,5-dicarboxyester as a starting material. Thereafter, potassium peroxodisulfate, iron sulfate, and 3,4-ethylenedioxythiophene prepared in advance are introduced into and reacted with a polystyrenesulfonic acid aqueous solution, so that a composition can be prepared, in which a polyanion such as polystyrenesulfonic acid forms a complex with a polythiophene such as poly(3,4-ethylenedioxythiophene).

As a water-based coating solution containing poly(3,4-ethylenedioxythiophene) and polystyrenesulfonic acid, a product sold by H.C. Starck Ltd. (German) under the trade name "Baytron" P, or the like can be employed.

By containing a resin such as a polyester resin, an urethane resin, an acrylic resin or an epoxy cross-linking agent other than the above-mentioned polythiophene-polyanion mixture in the polythiophene-polyanion mixture in the coating solution, the random network structure can be formed effectively. For example, when only the polythiophene-polyanion mixture is used as a solute, the polythiophene has few follow-up properties to stretching of the base material, and therefore the occurrence of cracks becomes marked, and the conductive portion tends to be independent and the network structure is hardly formed as a conductive portion. Naturally, the electrical conductivity of the film is hardly exhibited. On the other hand, when large amounts of these resins are added, the network structure is not formed. By adjusting the content of the polythiophene-polyanion mixture in the solute in the coating solution usually to 8 to 50 percent by weight, preferably to 10 to 50 percent by weight, and more preferably to 12 to 25 percent by weight, and on the other hand, by adjusting the content of the resin other than the polythiophene-polyanion mixture usually to 50 to 92 percent by weight, preferably to 50 to 90 percent by weight, and more preferably to 75 to 88 percent by weight, the random network structure is formed effectively.

Examples of preferable polyester resins contained in the coating solution include polymers or copolymers formed by using acid components selected from terephthalic acid, isophthalic acid, sebacic acid, and 5-sodium sulfoisophthalic acid and/or diol components selected from ethylene glycol, diethylene glycol, 1,4-butanediol, and neopentyl glycol. In the case where the water resistance is required, copolymers in which trimellitic acid is used as a copolymer component in place of 5-sodium sulfoisophthalic acid may also be suitably used.

Preferably, the glass transition temperature (hereinafter, abbreviated as "Tg") of the polyester resin is 0° C. to 130° C., and more preferably is 10° C. to 85° C. If the Tg is lower than 0° C., for example, a blocking phenomenon may occur, in which in winding up a conductive film provided with a conductive portion, the conductive portion is adhered to the base film when the conductive portion is provided on only the one side of the film and conductive portions are mutually adhered when the conductive portion is provided on both sides of the film. When the Tg is extremely high, it is undesirable since the stability and the dispersibility in water of the resin may become poor. An amount of the polyester resin to be added is preferably 10 to 50 percent by weight in the solute of the coating solution, and more preferably 17 to 34 percent by weight.

Further, as an epoxy-based cross-linking agent suitably added to the coating solution, for example, agents of sorbitol polyglycidyl ether-based, polyglycerol polyglycidylether-based, diglycerol polyglycidyl ether-based, polyethylene glycol diglycidyl ether-based, or the like may be used. Examples of suitable cross-linking agents may include an epoxy compound "DENACOL" (EX-611, EX-614, EX-614B, EX-512, EX-521, EX-421, EX-313, EX-810, EX-830, EX-850, etc.) produced by Nagase ChemteX Corporation, diepoxy and polyepoxy-based compounds (SR-EG, SR-8EG, SR-GLG, etc.) produced by SAKAMOTO YAKUHIN KOGYO CO., LTD., an epoxy cross-linking agent "EPICLON" EM-85-75W or CR-5L produced by DAINIPPON INK AND CHEMICALS, INCORPORATED. Among them, water-soluble cross-linking agents are preferable. An amount of the epoxy-based cross-linking agent to be added is preferably 25 to 75 percent by weight, and more preferably 30 to 60 percent by weight in the solute of the coating solution.

Furthermore, various additives such as antioxidants, heat stabilizers, weathering stabilizers, ultraviolet absorbers, organic lubricants, pigments, dyes, organic or inorganic fine particles, fillers, nucleating agents and the like may also be blended in the solute of the coating solution within the range of not detracting the effects of our disclosure.

As the method for coating the base film with the coating solution, for example, a reverse coating method, a spray coating method, a bar coating method, a gravure coating method, a rod coating method, and a die coating method can be used.

The thickness of the conductive portion prepared from this coating solution is not particularly limited, but preferably, it is usually in a range of 0.01 to 5 µm, and more preferably in a range of 0.02 to 2 µm. If the thickness of the conductive portion is too small, the electrical conductivity may become poor.

As a further preferable method for providing the conductive portion, a method in which the coating solution is applied during the step of manufacturing a polyester film and is stretched together with the base film is most suitable. For example, the film provided with the conductive portion can be prepared by the step (in-line coating method) in which a melt-extruded polyester film before crystalline orientation is done is stretched by about 2.5 to 5 times in a longitudinal direction, and a coating solution is continuously applied to the resulting monoaxially oriented film, and the film coated with the coating solution is dried while being passed through a stepwise-heated zone and stretched by about 2.5 to 5 times in a width direction, and furthermore, the resulting film is continuously led to a heating zone at 150° C. to 250° C., and crystalline orientation is completed. The coating solution used in this case is preferably a water-based coating solution from the viewpoints of environmental pollution and an explosion-protective property.

It is preferable that before the coating solution is applied, the surface of a base film is subjected to a corona discharge treatment and the like so that the wetting tension of the base film surface is preferably at least 47 mN/m, and more preferably at least 50 mN/m because the adhesion of the conductive portion to the base film can be improved. Naturally, a method of subjecting the monoaxially oriented film to a treatment for improving the wetting tension may be employed. Further, it is also preferable that a small amount of organic solvent such as isopropyl alcohol, butyl cellosolve, or N-methyl-2-pyrrolidone is contained in the coating solution and, thereby, the wettability and the adhesion to the base film are improved.

Next, the method for manufacturing a conductive film will be described in further detail with reference to the example in which polyethylene terephthalate (hereafter abbreviated as "PET") is used as the base film, although not limited to this.

The method for manufacturing a conductive film will be described with reference to further specific example.

PET pellets having an intrinsic viscosity of 0.5 to 0.8 dl/g are vacuum-dried and then are supplied to an extruder. The pellets are melted at 260° C. to 300° C., and are extruded from a T-die into the form of a sheet. The resulting sheet is wound around a mirror-finished casting drum having a surface temperature of 10° C. to 60° C. by the use of an electrostatic casting method, followed by cooling and solidifying, so that an unstretched PET film is prepared. This unstretched film is stretched by 2.5 to 5 times in a longitudinal direction (film traveling direction) between rolls heated to 70° C. to 120° C. At least one surface of this film is subjected to a corona discharge treatment so that the wetting tension of the surface is at least 47 mN/m, and the water-based coating solution that becomes a conductive portion is applied to the treated surface. This coated film is grasped with clips, and is led to a hot-air zone heated to 70° C. to 150° C. to be dried. The film is further stretched by 2.5 to 5 times in a width direction, and subsequently, is led to a heat treatment zone at 160° C. to 250° C. A heat treatment is performed for 1 to 30 seconds, so that crystalline orientation is completed. A treatment for relaxation of 1 to 10 percent in a width direction or a longitudinal direction may be performed as required during this heat treatment step.

It becomes possible to use this film as a electromagnetic interference film used in flat panel displays such as a plasma display panel and a liquid crystal television by providing a metal layer such as a copper layer on the network structure prepared from the above-mentioned coating solution to form a conductive portion consisting of a layer composed of a coating solution and a metal layer.

There is, for example, a method for applying electrolytic copper plating directly to a conductive film having a conductive portion prepared from the above-mentioned coating solution. Further, there is a method in which a nucleic agent for nonelectrolytic plating such as palladium is deposited on the conductive film having a conductive portion prepared from the above-mentioned coating solution, and then nonelectrolytic nickel plating or nonelectrolytic copper plating is applied. Further, there is another method in which a method for applying electrolytic copper plating onto the layer obtained by the above-mentioned nonelectrolytic plating is exemplified, a catalyst for nonelectrolytic plating, for example, metal fine particles such as a copper fine particle, a palladium fine particle and a silver fine particle, is mixed in the coating solution for forming a conductive portion in advance, and thereafter a conductive portion of the network structure is formed on a base film and nonelectrolytic plating is applied directly to the resulting conductive film to obtain a metal layer. Particularly, the method described last is useful because number of processes is small.

A size of the metal fine particle which can be used at this time is not particularly limited, but a number average particle diameter of 0.001 to 1 µm is preferable. When the number average particle diameter of the metal fine particles exceeds this range, the metal layer may be hardly formed in the form of a network. Preferably, the number average particle diameter of the metal fine particles is 0.001 to 0.5 µm, and more preferably 0.002 to 0.1 µm. A particle diameter of the metal fine particle contained in a metal fine particle layer may be large or small and may be irregular or uniform. Metal used for the metal fine particle is not particularly limited and platinum, gold, silver, copper, nickel, palladium, rhodium, ruthenium, bismuth, cobalt, iron, aluminum, zinc, and tin can be used, but particularly, palladium, silver, and copper, which become a catalyst of nonelectrolytic plating, can be suitably used. In addition, these metal may be used singly or in combination of two or more kinds.

Examples of methods of preparing metal fine particles include a chemical method in which a metal ion is reduced in a liquid layer to form a metal atom and the metal atom is grown to a nanoparticle through a atomic cluster, a technique in which a bulk metals is vaporized in an inert gas to form metal fine particles and these metal fine particles is collected with a cold trap, and a physical method in which a metal thin film obtained by vacuum deposition on a polymer thin film is heated to break the metal thin film and nanoparticles of broken metal is dispersed in a polymer in a solid state.

EXAMPLES

[Methods for Measuring Characteristic Properties and Method for Evaluating Effects]

Methods for measuring characteristic properties and methods for evaluating effects are as described below.

(1) Thickness of Conductive Portion

A sample, for example, a cross section of a laminated polyester film, was cut out into a extremely thin slice, and this slice was observed and photographed with a TEM (transmission electron microscope) using a method of an extremely thin slice stained by ruthenic acid ($RuO_4$) or osmic acid ($OsO_4$), or double-stained by both of $RuO_4$ and $OsO_4$. The thickness was determined from the cross-sectional photograph Observation Method
Apparatus: transmission electron microscope (H-7100FA, manufactured by Hitachi, Ltd.)
Measuring condition: acceleration voltage 100 kV
Sample preparation: Extremely thin slice method
Observation magnification: 20000 times to 200000 times (2) Observation Surface The surface of a film was observed with a scanning electron microscope (S-2100A type Hitachi Scanning Electron Microscope, manufactured by Hitachi, Ltd.), and a ratio of a major axis length to a minor axis length of an area (open area) surrounded by the network of the conductive portion, in which the base film was exposed, a configuration of the network structure, and a width of the network structure were observed. Further, in the above observation, a magnification of the observation image was adjusted in such a way that the number of open areas was 10 or more. The ratio of a major axis length to a minor axis length was determined by measuring all of open areas in a region observed and averaging the measurements. However, the open area, a part of which was out of a field of view and the shape of which could not be identified in the region, was excluded from calculation of this ratio.

(3) Area Ratio of Portion Where a Conductive Portion Does Not Exist

In the images observed in the above paragraph (2), areas of the network structure were marked with black color and the respective areas were separated into a white portion (area other than the network structure) and a black portion (area of the network structure) by an image analyzer, and an aperture ratio (%) was calculated according to the following equation.

Area ratio of portion where a conductive portion does not exist (%)=area of white portion/(area of white portion+area of black portion)×100

(4) Electrical Conductivity

The electrical conductivity was measured based on the surface resistivity. A sample was left standing for 24 hours at normal conditions (23° C., relative humidity 65 percent) and, in that atmosphere, the surface resistivity was measured with LORESTA-EP (manufactured by Mitsubishi Chemical Corporation, Model: MCP-T360) according to JIS K 7194. Measuring unit is $\Omega/\square$. This apparatus can measure in a range of $1 \times 10^6$ $\Omega/\square$ or less. On the other hand, when a measuring range is $1 \times 10^6$ $\Omega/\square$ or more, after the application of an applied voltage of 100 V for 10 seconds, the surface resistivity was measured with a digital super-high resistance/microammeter R8340A (manufactured by ADVANTEST CORPORATION). The unit is $\Omega/\square$.

(5) Transparency

The transparency was evaluated by the haze and the total light transmittance. A film was left standing for 2 hours at normal conditions (23° C., relative humidity 65 percent), and then the haze and the total light transmittance were measured with a fully automatic direct-reading Haze Computer "HGM-2DP" manufactured by SUGA TEST INSTRUMENTS Co., Ltd. An average value of 3 measurements was taken as the haze value and the total light transmittance of the sample. In addition, the film was placed in such a way that light enters from the surface on which the conductive portion was provided to be measured.

(6) Number Average Particle Diameter of Metal Fine Particle

A solution in which metal fine particles are dispersed was applied onto a copper mesh and this mesh was observed with a transmission electron microscope (H-7100FA, manufactured by Hitachi, Ltd.) to determine a number average particle diameter of metal fine particles. Particle diameters of 100 metal fine particles were measured and an average thereof was taken as a number average particle diameter.

(7) Anti-moiré phenomenon

The conductive film of our disclosure or the electromagnetic interference film was held just anterior to a flat panel display screen on which a image is displayed in such a way that the screen and the film are in parallel with each other, and a substrate was rotated by 360° angle while maintaining a state in which the screen and the film surface are in parallel with each other, and the occurrence of the moiré phenomenon during this rotation was visually checked to evaluate the anti-a moiré phenomenon. The evaluations were performed using a liquid crystal display "E152FPb" manufactured by Dell Inc. as a flat pane display.

Example 1

First, the following coating solution for forming a conductive portion was prepared.

"Coating Solution for Forming a Conductive Portion"

Coating solution A1:
a water-based coating solution ("Baytron" P produced by H.C. Starck Ltd. (German)) containing poly-3,4-ethylenedioxythiophene and polystyrenesulfonic acid Coating solution B1:
a water-based coating solution in which a granular polyester resin (glass transition temperature: 48° C.) composed of the following copolymer composition was dispersed in water.

Acid components

| | |
|---|---|
| terephthalic acid | 60 mole percent |
| isophthalic acid | 30 mole percent |
| 5-sodium sulfoisophthalic acid | 10 mole percent |

Diol components

| | |
|---|---|
| ethylene glycol | 95 mole percent |
| diethylene glycol | 3 mole percent |
| polyethylene glycol (molecular weight 600) | 2 mole percent |

Coating solution C1:
    a water-based coating solution in which polyglycerol polyglycidyl ether-based epoxy cross-linking agent ("DENACOL" EX-512 produced by Nagase ChemteX Corporation (molecular weight about 630)) serving as an epoxy cross-linking agent was dissolved in water.

A mixture prepared by mixing the above-described coating solution A1 and coating solution C1 at a ratio of coating solution A1/coating solution C1=16/50 on a weight of solid basis was aged at room temperature for 5 days (abbreviated to as an aged coating solution 1). Then, a coating solution for forming a conductive portion was prepared by mixing this aged coating solution 1 and the coating solution B1 at a ratio of aged coating solution 1/coating solution B1=66/34 on a weight of solid basis. At this time, a ratio between the coating solutions on a weight of solid basis was coating solution A1/coating solution B1/coating solution C1=16/34/50.

Next, forming of a film and application of the above coating solution were performed by the following steps.

PET pellets (an intrinsic viscosity 0.65 dl/g) were adequately vacuum-dried and then were supplied to an extruder. The pellets were melted at a temperature of 285° C., and were extruded from a T-die into the form of a sheet. The resulting sheet was wound around a mirror-finished casting drum having a surface temperature of 25° C. by the use of an electrostatic casting method, followed by cooling and solidifying. The unstretched film thus prepared was heated to 89° C., and was stretched by 3.3 times in a longitudinal direction, so that a monoaxially oriented film was prepared. This monoaxially oriented film was subjected to a corona discharge treatment in air in order that the wetting tension of the film became 55 mN/m. A coating solution for forming a conductive portion described below was applied to the treated surface.

Figure 4:
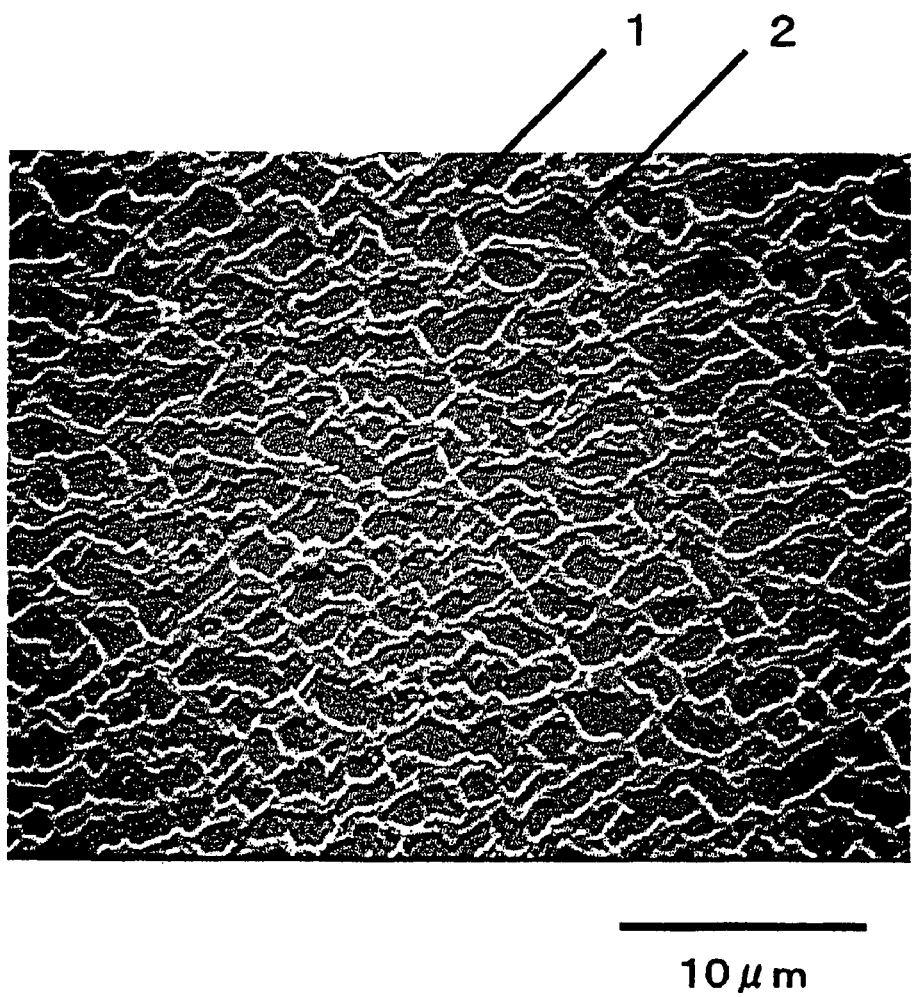
FIG. 4 is a scanning electron microscope observation image showing a random network structure in Example 1.
Figure 5:
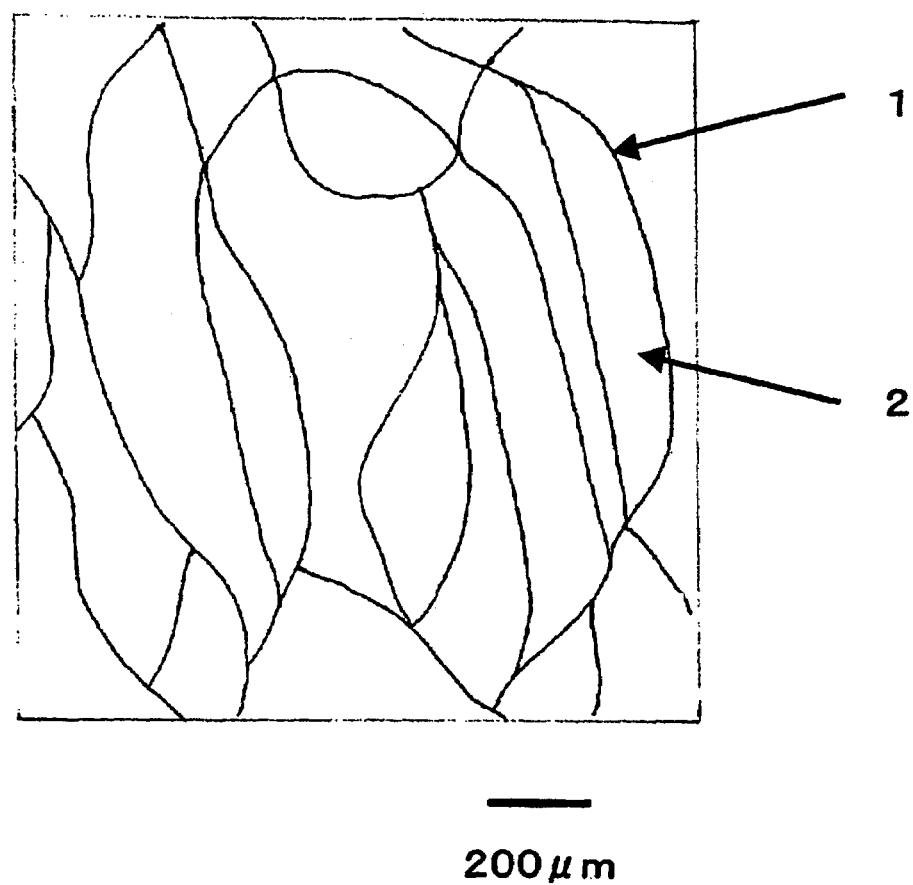
FIG. 5 is a scanning electron microscope observation image showing a random network structure in Comparative Example 3.

The monoaxially oriented film to which the coating solution was applied was grasped with clips, and was led to a preheating zone. After drying was performed at a temperature of 95° C., the film was subsequently continuously stretched by 4.0 times in a width direction in a heating zone at a temperature of 110° C., and furthermore, was subjected to a heat treatment in a heating zone at a temperature of 230° C., so that a PET film provided with a conductive portion was prepared, wherein crystalline orientation was completed. The thickness of the obtained PET film was 100 μm, and the thickness of the conductive portion was 0.02 μm on average. The results are shown in Table 1. Excellent transparency and electrical conductivity were exhibited. A moiré phenomenon did not arise. A scanning electron microscope (SEM) observation image (magnification of 3000 times) of the conductive film having a conductive portion of a random network structure in the present Example is shown in FIG. 4.

Example 2

A PET film provided with a conductive portion was prepared by the same procedure as in Example 1 except that a coating solution for forming a conductive portion described below was used in place of the coating solution for forming a conductive portion used in Example 1.

"Coating Solution for Forming a Conductive Portion"
    With respect to coating solutions A1, B1, and C1, the same coating solutions as in Example 1 were used.

A mixture prepared by mixing the above-described coating solution A1 and coating solution C1 at a ratio of coating solution A1/coating solution C1=8/75 on a weight of solid basis was aged at room temperature for 5 days (abbreviated to as an aged coating solution 2). Then, a coating solution for forming a conductive portion was prepared by mixing this aged coating solution 2 and the coating solution B1 at a ratio of aged coating solution 2/coating solution B1=83/17 on a weight of solid basis. The results are shown in Table 1. Excellent transparency and electrical conductivity were exhibited. A moiré phenomenon did not arise.

Example 3

A PET film provided with a conductive portion was prepared by the same procedure as in Example 1 except that a coating solution for forming a conductive portion described below was used in place of the coating solution for forming a conductive portion used in Example 1.

"Coating Solution for Forming a Conductive Portion"
    With respect to coating solutions A1, B1, and C1, the same coating solutions as in Example 1 were used.

A mixture prepared by mixing the above-described coating solution A1 and coating solution C1 at a ratio of coating solution A1/coating solution C1=25/25 on a weight of solid basis was aged at room temperature for 5 days (abbreviated to as an aged coating solution 3). Then, a coating solution for forming a conductive portion was prepared by mixing this aged coating solution 3 and the coating solution B1 at a ratio of aged coating solution 3/coating solution B1=50/50 on a weight of solid basis. The results are shown in Table 1. Excellent transparency and electrical conductivity were exhibited. A moiré phenomenon did not arise.

Example 4

A PET film provided with a conductive portion was prepared by the same procedure as in Example 1 except that a coating solution for forming a conductive portion described below was used in place of the coating solution for forming a conductive portion used in Example 1.

"Coating Solution for Forming a Conductive Portion"
    With respect to coating solutions A1, the same coating solution as in Example 1 was used.
    Coating solution B2:
        a water-dispersed of a polyester resin (glass transition temperature: 38° C.) composed of the following copolymer composition.

<Copolymer Components>

Acid components

| isophthalic acid | 90 mole percent |
| --- | --- |
| 5-sodium sulfoisophthalic acid | 10 mole percent |

Glycol components

| ethylene glycol | 2 mole percent |
| --- | --- |
| diethylene glycol | 78 mole percent |
| cyclohexanedimethanol | 20 mole percent |

Coating solution C2:

a water-based coating solution in which polyhydroxyalkane polyglycidyl ether-based epoxy cross-linking agent (CR-5L (epoxy equivalent 180) produced by DAINIPPON INK AND CHEMICALS, INCORPORATED) serving as an epoxy cross-linking agent was dissolved in water.

A mixture prepared by mixing the above-described coating solution A1 and coating solution C2 at a ratio of coating solution A1/coating solution C2=16/50 on a weight of solid basis was aged at room temperature for 5 days (abbreviated to as an aged coating solution 4). Then, a coating solution for forming a conductive portion was prepared by mixing this aged coating solution 4 and the coating solution B2 at a ratio of aged coating solution 4/coating solution B2=66/34 on a weight of solid basis. At this time, a ratio between the coating solutions on a weight of solid basis was coating solution A1/coating solution B2/coating solution C2=16/34/50. The results are shown in Table 1. Excellent transparency and electrical conductivity were exhibited. A moiré phenomenon did not arise.

Example 5

A PET film provided with a conductive portion was prepared by the same procedure as in Example 1 except that a coating solution for forming a conductive portion described below was used in place of the coating solution for forming a conductive portion used in Example 1.

"Coating Solution for Forming a Conductive Portion"

With respect to coating solutions A1, B1, and C1, the same coating solutions as in Example 1 were used.

A mixture prepared by mixing the above-described coating solution A1 and coating solution C1 at a ratio of coating solution A1/coating solution C1=16/50 on a weight of solid basis was aged at room temperature for 5 days (abbreviated to as an aged coating solution 1). Then, this aged coating solution 1 and the coating solution B1 was mixed at a ratio of aged coating solution 1/coating solution B1=66/34 on a weight of solid basis to obtain a mixture. Further, silver bromide powder (produced by Wako Pure Chemical Industries, Ltd.) was ground for 1 hour with a mortar to obtain more fine powder and this more fine powder was dispersed in an aqueous solution of a nonionic surfactant "OLFINE" EXP-4051F (produced by Nissin Chemical Industry Co., Ltd.) with a homogenizer to obtain a dispersion. A coating solution for forming a conductive portion was prepared by adding 5 parts by weight of the obtained dispersion on a weight of solid basis to the obtained mixture. At this time, a ratio between the respective coating solutions on a weight of solid basis was coating solution A1/coating solution B1/coating solution C1/silver bromide=16/34/50/5.

The obtained conductive film having a conductive portion of a random network structure was subjected to an ultraviolet irradiation treatment (wattage of a lamp 120 W, a line speed 1 m/min, irradiation intensity 1000 mJ/cm$^2$, the number of irradiation twice) and was exposed, and then the exposed film was developed and fixed using a commercially available developing solution ("FUJIDOL" E (for monochrome photographs) produced by FUJIFILM Corporation) and a commercially available fixing solution ("FUJIFIX" (for monochrome films) produced by FUJIFILM Corporation). The following nonelectrolytic copper plating was carried out using silver produced in the network structure as a catalyst.

<Nonelectrolytic Copper Plating>

| Plating solution: | "MELPLATE" CU-5100 produced by Meltex Inc. |
| --- | --- |
| Temperature in plating: | 50° C. |
| Plating time: | 3 minutes |

A conductive portion consisting of a layer formed from a coating solution and a metal layer could be prepared by providing metal copper layer on the conductive portion formed from the coating solution for a conductive film. The results are shown in Table 2. Excellent transparency and electrical conductivity were exhibited. A moiré phenomenon did not arise.

Synthetic Example 1

Monoethanolamine was added dropwise to an aqueous solution of silver nitrate to obtain an aqueous solution of silver alkanolamine complex (aqueous solution 1). Separately from this solution, an aqueous solution (aqueous solution 2) formed by adding monoethanolamine to an aqueous solution in which quinine was dissolved as a reducing agent was prepared. Next, the aqueous solution 1 and the aqueous solution 2 were simultaneously poured into a plastic container and the silver alkanolamine complex was reduced to silver fine particles. This mixture solution was filtrated, washed with water and dried to obtain silver fine particles. Further, these silver fine particles were re-dispersed in water to obtain a silver fine particle dispersion. Number average particle diameter of silver fine particles was 1.4 μm.

Example 6

Figure 3:
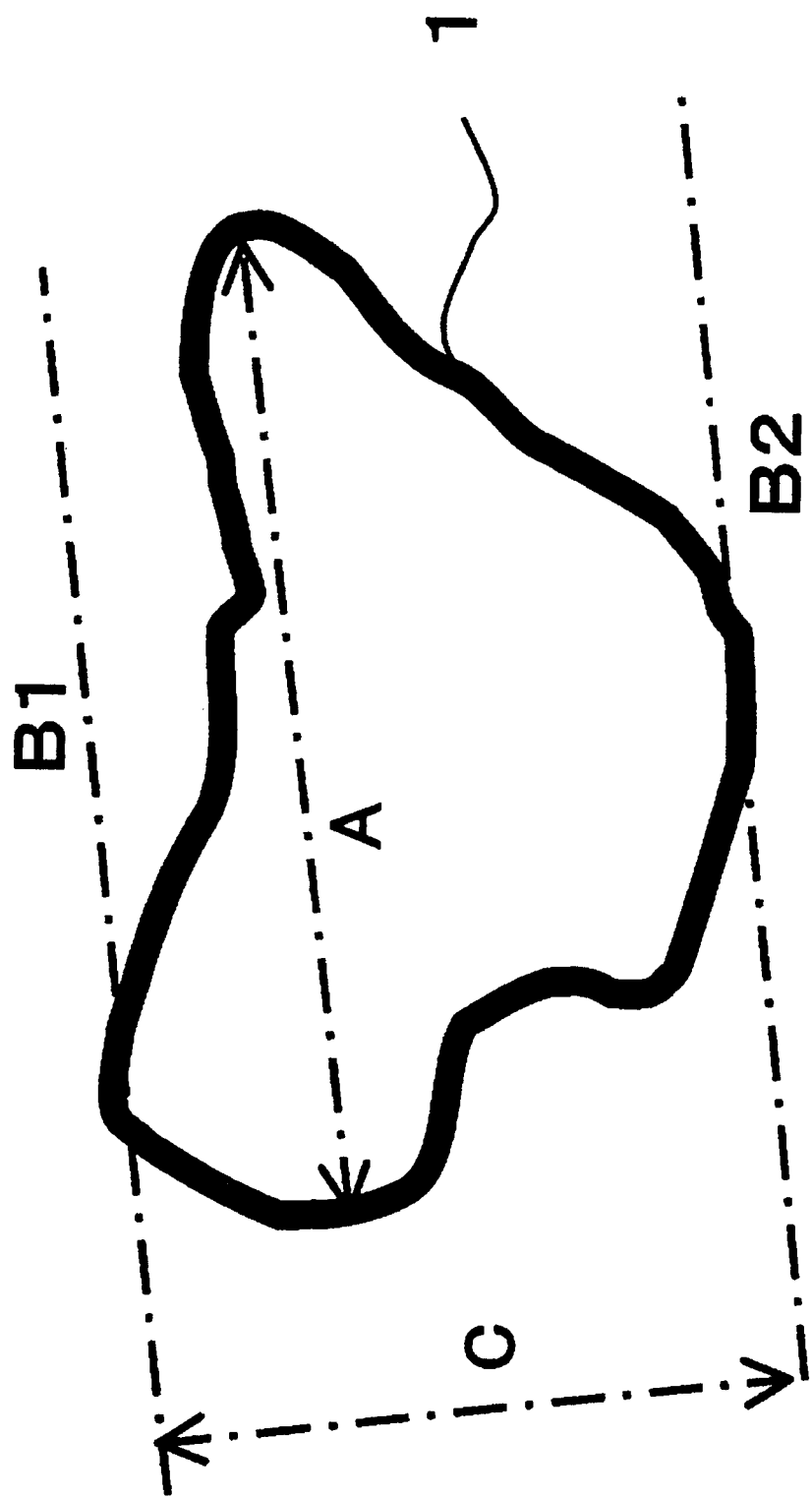
FIG. 3 is a view showing a method for determining a major axis length and a minor axis length.

A coated film in which a layer of a silver fine particle was laminated in the form of random network was obtained by printing the silver fine particle solution prepared in (Synthetic Example 1) in a random network structure shown in FIG. 3 on one side of a biaxially oriented polyethylene terephthalate film ("Lumirror" U94 produced by Toray Industries, Inc.) by screen printing and drying the printed solution at 120° C. for 1 minute. The thickness of the network structure was adjusted to 2 μm. The layer of a silver fine particle of this coated film was immersed in 0.1 N hydrochloric acid (N/10 hydrochloric acid produced by NACALAI TESQUE, Inc.) for 2 minutes. Then, after the coated film was taken out and washed with water, it was dried at 120° C. for 1 minute.

The results are shown in Table 2. Excellent transparency and electrical conductivity were exhibited. A moiré phenomenon did not arise.

Example 7

The nonelectrolytic copper plating described in Example 5 was applied to the coated film prepared in Example 6 for 20 minutes. The results are shown in Table 2. Excellent transparency and electrical conductivity were exhibited. A moiré phenomenon did not arise.

Comparative Example 1

A coated film in which a layer of a silver fine particle was provided in the form of grid was obtained by printing the silver fine particle solution prepared in Synthetic Example 1 in the form of grid having a line thickness of 3 μm, a line width of 35 μm, and a pitch of 300 μm on one side of a biaxially oriented polyethylene terephthalate film ("Lumirror" U94 produced by Toray Industries, Inc.) by screen printing and drying the printed solution at 120° C. for 1 minute. The results are shown in Table 2. This coated film is low in electrical conductivity and produced a moiré phenomenon.

Comparative Example 2

The nonelectrolytic plating was performed for 40 minutes in Example 6. The results are shown in Table 2. This film was extremely low in the transparency.

Comparative Example 3

To tetraethoxysilicate, water, hydrochloric acid, and isopropyl alcohol were added, and the resulting mixture was stirred at room temperature for 30 minutes and hydrolyzed. The obtained solution was applied onto a biaxially oriented polyethylene terephthalate film ("Lumirror" T60 produced by Toray Industries, Inc.) with a bar coater in such a way that a coated thickness after drying is 0.4 μm, and the applied solution was dried at 120° C. for 30 minutes to obtain a sol-gel film. A coated film produced cracks due to the heat shrinkage during curing and this cracks were used as a random network structure.

As with Example 6, a conductive film having a conductive portion of 3 μm in thickness having the network structure was obtained by printing conductive thermosetting silver paste (produced by TOYOBO CO., LTD., conductive thermosetting silver paste DW-250H-5) in a random network structure described above on one side of a biaxially oriented polyethylene terephthalate film ("Lumirror" U94 produced by Toray Industries, Inc.) by screen printing and drying the printed solution at 130° C. for 30 minutes. The results are shown in Table 2. This film exhibited strong anisotropy such that the brightness varied depending on viewing angle and was not suitable for a display.

Comparative Example 4

A PET film was prepared by the same procedure as in Example 1 except that a coating solution for forming a conductive portion described below was used in place of the coating solution for forming a conductive portion used in Example 1.

"Coating Solution for Forming a Conductive Portion"
  With respect to coating solutions A1, the same coating solution as in Example 1 was used.

A coating solution for forming a conductive portion was prepared by using only the above-mentioned coating solution A1. That is, a resin other than the polythiophene-polyanion mixture is not mixed. The results are shown in Table 2. This film was extremely low in the transparency and electrical conductivity, and exhibited remarkable occurrences of cracks and strong anisotropy such that the brightness varied depending on viewing angle.

TABLE 1

| | Composition of Coating solution for conductive portion | | Line width (μm) | | Haze (%) | Total light transmittance (%) | Electrical conductivity ($\Omega/\square$) | Aperture ratio (%) | Ratio of major axis length to minor axis length | Moiré |
|---|---|---|---|---|---|---|---|---|---|---|
| | Type | Ratio on weight of solid basis | Minimum | Maximum | | | | | | |
| Example 1 | A1/B1/C1 | 16/34/50 | 0.2 | 1.1 | 3.7 | 88 | $4 \times 10^4$ | 60 | 1.8 | Not arise |
| Example 2 | A1/B1/C1 | 8/17/75 | 0.2 | 1 | 2.8 | 89 | $8 \times 10^4$ | 55 | 1.7 | Not arise |
| Example 3 | A1/B1/C1 | 25/50/25 | 0.4 | 2 | 4.2 | 88 | $1 \times 10^4$ | 65 | 2.5 | Not arise |
| Example 4 | A1/B2/C2 | 16/34/50 | 0.2 | 1.1 | 3 | 89 | $1 \times 10^4$ | 60 | 1.8 | Not arise |

TABLE 2

| | Constitution of network structure | Line width (μm) | | Haze (%) | Total light transmittance (%) | Electrical conductivity ($\Omega/\square$) | Aperture ratio (%) | Ratio of major axis length to minor axis length | Moiré |
|---|---|---|---|---|---|---|---|---|---|
| | | Minimum | Maximum | | | | | | |
| Example 5 | Conductive layer of Example 1 containing silver bromide & nonelectrolytic plating | 0.5 | 1.5 | 4.3 | 60 | 100 | 50 | 1.8 | Not arise |
| Example 6 | Screen printing of random network structure | 15 | 20 | 1.8 | 70 | 8 | 80 | 1.5 | Not arise |
| Example 7 | Screen printing of random network structure & nonelectrolytic plating | 18 | 25 | 2 | 63 | 0.8 | 70 | 1.5 | Not arise |

TABLE 2-continued

| | Constitution of network structure | Line width (μm) | | Haze (%) | Total light transmittance (%) | Electrical conductivity (Ω/□) | Aperture ratio (%) | Ratio of major axis length to minor axis length | Moiré |
|---|---|---|---|---|---|---|---|---|---|
| | | Minimum | Maximum | | | | | | |
| Comparative Example 1 | Screen printing of grid pattern having a certain pitch | 35 | 35 | 3 | 70 | $1 \times 10^6$ | 80 | 1 | Arose |
| Comparative Example 2 | Screen printing of random network structure & nonelectrolytic plating | 30 | 40 | 4 | 36 | 0.1 | 40 | 1.5 | Not arise |
| Comparative Example 3 | Screen printing of random network structure | 20 | 20 | 1.5 | 84 | 0.5 | 95 | 3.8 | Not arise |
| Comparative Example 4 | Coating solution containing only A1 | 0.5 | 4 | 8 | 87 | $1 \times 10^{14}$ | 67 | Unmeasurable | Unmeasurable |

INDUSTRIAL APPLICABILITY

The conductive film has a random network structure and has transparency and a high level of electrical conductivity. Therefore, by providing a metal layer such as a copper layer on the random network structure, the conductive film is useful as an electromagnetic interference film hardly causing a moiré phenomenon, which is suitably used for flat panel displays such as a plasma display panel and a liquid crystal television.

The invention claimed is:

1. A conductive film, wherein a conductive portion of a random network structure is present on at least one surface of a base film, a line width of the conductive portion composing said network structure is 30 μm or less, an area of portions where the conductive portion is not present is 50% or more with respect to an area of the conductive film, and an average of ratios of a major axis length to a minor axis length of an area surrounded by the network of the conductive portion, in which the base film is exposed, is equal to or larger than 1.2 and is equal to or less than 3.5.

2. The conductive film according to claim 1, wherein the conductive portion of a random network structure is obtained by the steps of applying a solution for forming a conductive portion to the base film, and drying said solution.

3. The conductive film according to claim 1, wherein the conductive portion contains a conductive polymer and/or a conductive particle.

4. The conductive film according to claim 1, wherein the conductive portion of the conductive film includes a layer containing a conductive polymer and/or a conductive particle, and a metal layer provided on said layer.

5. The conductive film according to claim 4, wherein the metal layer comprises copper.

6. The conductive film according to claim 5, wherein said conductive film is an electromagnetic interference film.

7. The conductive film according to claim 1, wherein the base film is a laminated film.

* * * * *